United States Patent [19]

Usifer et al.

[11] Patent Number: 5,736,190

[45] Date of Patent: Apr. 7, 1998

[54] EXTERIOR PROTECTIVE LAYER FOR AN ELECTRICAL COMPONENT

[75] Inventors: Douglas A. Usifer, Belle Mead; Melvin Brauer, East Brunswick, both of N.J.; James C. Chang, Crystal Lake, Ill.; Yuan Chieh Chu, East Windsor, N.Y.

[73] Assignee: Cashem, Inc., Bayonne, N.J.

[21] Appl. No.: 606,374

[22] Filed: Feb. 23, 1996

Related U.S. Application Data

[62] Division of Ser. No. 218,010, Mar. 25, 1994.

[51] Int. Cl.$^6$ .................... B05D 1/36; B05D 5/12
[52] U.S. Cl. .................... 427/96; 427/104; 427/116; 427/118; 427/120; 427/123; 427/126.1; 427/383.1; 427/393.5; 427/404; 427/412.1; 427/417.8
[58] Field of Search .................. 427/96, 80, 104, 427/116, 118, 126.6, 123, 126.1, 126.2, 383.1, 393.5, 404, 412.1, 419.8

[56] References Cited

U.S. PATENT DOCUMENTS

| | | | |
|---|---|---|---|
| 3,838,093 | 9/1974 | Owston | 260/33.8 |
| 4,076,767 | 2/1978 | Samejima | 260/862 |
| 4,271,258 | 6/1981 | Watariguchi | 430/284 |
| 4,331,795 | 5/1982 | Ukita et al. | 526/273 |
| 4,336,345 | 6/1982 | Lewis et al. | 525/107 |
| 4,367,314 | 1/1983 | Kageyama et al. | 525/168 |
| 4,446,246 | 5/1984 | McGinnis | 502/155 |
| 4,503,186 | 3/1985 | Sugio et al. | 525/63 |
| 4,533,598 | 8/1985 | Downey et al. | 428/380 |
| 4,569,976 | 2/1986 | Zimmerman et al. | 526/204 |
| 4,604,253 | 8/1986 | Gomez | 264/211 |
| 4,623,696 | 11/1986 | Mabrey et al. | 525/33 |
| 4,639,483 | 1/1987 | Billigmmeier et al. | 524/296 |
| 4,645,816 | 2/1987 | Pohl et al. | 528/28 |
| 4,666,968 | 5/1987 | Downey et al. | 524/296 |
| 4,734,976 | 4/1988 | Matson | 29/606 |
| 4,756,851 | 7/1988 | Billigmeier et al. | 252/572 |
| 4,849,579 | 7/1989 | Chapin et al. | 174/74 R |
| 5,045,381 | 9/1991 | Suzuki et al. | 428/209 |
| 5,169,716 | 12/1992 | Croft et al. | 428/379 |
| 5,180,757 | 1/1993 | Lucey | 522/76 |
| 5,302,627 | 4/1994 | Field et al. | 522/13 |

FOREIGN PATENT DOCUMENTS 2 196 012   4/1988   United Kingdom .

OTHER PUBLICATIONS

*Plastics Handbook*, McGraw–Hill, Inc., pp. 139–140 (1994).

*Primary Examiner*—Erma Cameron
*Attorney, Agent, or Firm*—Pennie & Edmonds

[57] ABSTRACT

An electrical component comprising an electrical component having an exterior protective layer on at least a portion of a surface. The layer is a cured copolymer of a reaction between at least one oligomer having a terminal ethylenically unsaturated group and at least one monomer having a terminal ethylenically unsaturated group. Alternatively, the layer is a cured copolymer of a reaction between at least two oligomers having a terminal ethylenically unsaturated group. The copolymerization reaction is preferably in the presence of a free radical initiator curing agent and a transition metal catalyst.

42 Claims, No Drawings

EXTERIOR PROTECTIVE LAYER FOR AN ELECTRICAL COMPONENT

This is a division of application Ser. No. 08/218,010, filed Mar. 25, 1994.

FIELD OF THE INVENTION

1. Technical Field

The invention relates to an electrical component having on at least a portion of its outer surface an exterior protective layer. The invention also relates to a process for providing an exterior protective layer on the component. The layer is a reaction product of the copolymerization at least one hydrophobic terminal olefinic oligomer and at least one terminal olefinic monomer or the copolymerization of at least two hydrophobic terminal olefinic oligomers. Preferably, the copolymerization is conducted in the presence of a free radical initiator and a transition metal catalyst.

2. Background of the Art

It is necessary to protect electrical components from corrosion due to dirt, dust, moisture, mildew, physical abrasion, damage from handling or short circuit, etc. Electrical components must be protected from environmental, mechanical and electrical interferences.

For example, U.S. Pat. No. 4,666,968 of Downey et al. discloses a barrier for telecommunication cable splices comprised of are-enterable urethane gel system. The reenterable property of the gel allows it to be easily cut and removed from the electrical component when additional electrical connection or repairs are to be made. While this gel is highly effective, there is a perceived need for alternative hydrophobic materials that are considered to be less toxic than urethanes.

Similarly, it is known to protect circuit boards and other sensitive electronic components using conformal coatings, such as those derived from acrylic, polyurethane, silicone, polyamide, epoxy and parylene chemistry. However, these coatings are generally thin and cannot be removed easily from the component to which they are applied, so that it is relatively difficult to gain access to the underlying component to effect electrical repairs or additional connections.

Additionally, it is known to insulate armature and field coils of motors using the cured product of a blend of unsaturated polyesters, made by condensing at least one polycarboxylic acid and/or anhydride containing an ethylenically unsaturated backbone (terminal saturation) with at least one polyol, and ethylenically unsaturated monomers, where the polyester is modified with dicyclopentadiene and tris(2-hydroxyethyl)isocyanurate, as shown in U.S. Pat. No. 4,623,696 of Mabrey et al. However, this insulation is not sufficiently moisture resistant as it has a high number of hydrolytically unstable ester linkages.

It is generally known that acrylate monomer, oligomer and/or polymer can be polymerized with a free radical initiator curing agent in the presence of a metal salt catalyst for use as an adhesive. For example, U.S. Pat. No. 4,446,246 of McGinnis discloses curing a peroxide-curable ethylenically unsaturated (e.g., acrylic) composition. The composition has at least one ethylenic-functional compound selected from an ethylenic-functional monomer, oligomer, polymer, or mixtures thereof and a peroxide curing agent. The composition is blended with a $Cu^{+1}$ activator to activate the peroxide and cure the ethylenically-functional compound. The peroxide initiator and the activator are contained in separate packages. The cured product is disclosed as a structural adhesive for industries such as aircraft, housing and construction, automotive and footwear.

Similarly, additional patents disclose various polymerization curing systems for adhesives. For example, U.S. Pat. No. 3,838,093 of Owston discloses a standard redox system of cobalt naphthanate and MEK hydroperoxide for use with reactive acrylic adhesive formulations while U.S. Pat. No. 4,569,976 of Zimmerman et al. discloses a thiourea activator for activating peroxides in order to promote the cure of acrylate monomers and/or acrylate oligomers in the preparation of adhesives.

Japanese Patent Application No. 60-067581 of Nitto Electric Ind. KK discloses a process of modifying an adhesive film or tape by blending an adhesive composition comprising vinyl monomer and/or oligomer with a polymerization initiator and a polymerization accelerator and coating the composition on an adhesive layer to polymerize the monomer or oligomer.

U.S. Pat. No. 4,331,795 of Ukita et al. discloses a two liquid composition adhesive. The first composition comprises an acrylic monomer, a butadiene type oligomer having a terminal ethylenically unsaturated group and an organic hydroperoxide and an aromatic amine and/or a pyridine derivative. The second composition comprises an acrylic monomer, a butadiene type oligomer having a terminal ethylenically unsaturated group and a cobalt salt of organic acid.

Japanese Patent Application No. 53-041333 of Electro-Chemical Ind. KK discloses a two-liquid adhesive composition where both liquids contain an oligomer having terminal ethylenically unsaturated groups and a polymerizable acrylic monomer. The first solution additionally contains an organic peroxide and the second solution additionally contains a cure-accelerating agent. A similar two-liquid adhesive composition is disclosed in Japanese Patent Application No. 53-078240 of Electro-Chemical Ind. KK as effective for adhering metal sheets of less than 3 mm thick.

These references are specifically directed to adhesive compositions which are used to join various components together. Thus, no data or information is presented on the use or ability of such adhesives as an exterior protective layer. Moreover, a need exists for an improved exterior barrier layer that can be applied to electrical components, such as a cable splice, a circuit board or a coil wound motor, to protect them from environmental, mechanical and electrical interferences. It is also preferable that the exterior protective layer be reenterable so that it can be easily removed to effect repairs or modifications to the electrical components.

SUMMARY OF THE INVENTION

The present invention relates to an article comprising an electrical component wherein at least a portion of a surface of the component has an exterior protective layer of a cured copolymer. This copolymer is formed by a reaction between at least one oligomer having a terminal ethylenically unsaturated group and at least one monomer having a terminal ethylenically unsaturated group. Alternatively, this copolymer is formed by a reaction between at least two oligomers having a terminal ethylenically unsaturated group. The reaction is preferably conducted in the presence of a free radical initiator curing agent and a transition metal catalyst.

The present invention also relates to a method for providing an exterior protective layer on at least a portion of the outer surface of an electrical component. This is done by contacting the surface portion of the component with at least one oligomer having a terminally ethylenically unsaturated group, at least one polymerizable monomer having a terminally ethylenically unsaturated group, a free radical initiator curing agent, and a transition metal salt. The oligomer and the monomer are then copolymerized on the surface portion to form an exterior moisture barrier layer on the electrical component. Alternatively, the surface portion may be contacted with at least two oligomers having a terminally ethylenically unsaturated group, a free radical initiator curing agent, and a transition metal. The oligomers are then copolymerized on the surface portion to form an exterior moisture barrier layer on the electrical component.

DETAILED DESCRIPTION OF THE INVENTION

The present invention teaches the protection of electrical components by providing an exterior protective layer on at least a portion of the surface. The protective layer is a cured copolymer formed by the reaction of at least one oligomer having a terminal ethylenically unsaturated group and at least one monomer having a terminally ethylenically unsaturated group. Alternatively, the moisture barrier layer is a cured copolymer formed by the reaction of at least two oligomers having a terminal ethylenically unsaturated group. The reaction is preferably conducted in the presence of a free radical initiator curing agent and a transition metal catalyst.

The monomer unit of the oligomer or oligomers corresponds to the formula

in which X is hydrogen, hydroxyl, a straight or branched $C_1$–$C_6$ alkyl or olefinic group, optionally substituted with one or more hydroxyl groups, and R is a monomer unit. Preferably, R is a vinyl, a vinyl ester, a vinyl ether, an allyl, an acrylate or a methacrylate unit. The most advantageous compounds are the acrylates and methacrylates. One skilled in the art can determine by routine selection and testing many other suitable monomers which can be used in the present invention. Generally, this selection is made based on the desired properties of the protective layer.

The oligomers are preferably a $C_4$ to $C_8$ diene type oligomers. Of these, the butadiene type oligomers, in particular polybutadiene acrylates, are the most preferred. Other suitable oligomers include without limitation urethane acrylates, epoxy acrylates, or any hydrolytically stable, low molecular weight, mono- or multifunctional oligomeric material containing a terminal olefinic group. One skilled in the art can determine by routine selection and testing many other suitable oligomers which can be used in the present invention. Generally, this selection is also made based on the desired properties of the protective layer.

The monomer for reaction with the oligomer corresponds to the formula

in which X is hydrogen, hydroxyl, a straight or branched $C_1$–$C_6$ alkyl or olefinic group, optionally substituted with one or more hydroxyl groups, and R is a monomer unit, preferably a vinyl, a vinyl ester, a vinyl ether, an allyl, an acrylate or a methacrylate unit. The monomer may be the same as the monomer unit of the oligomer and one or more may be used in the present invention.

Suitable acrylate or methacrylate monomeric units include methyl acrylate, methyl methacrylate, ethyl acrylate, ethyl methacrylate, propyl acrylate, propyl methacrylate, butyl acrylate, butyl methacrylate, 2-ethyloyhexyl acrylate, 2-ethylhexyl methacrylate, lauryl methacrylate, stearyl methacrylate, isobornyl acrylate, diethylene glycol diacrylate, diethylene glycol dimethacrylate, 1,6-hexanediol diacrylate, 1,6-hexanediol dimethacrylate, neopentyl glycol diacrylate, neopentyl glycol dimethacrylate, polyethylene glycol diacrylate, polyethylene glycol dimethacrylate, tetraethylene glycol dimethacrylate, tetraethylene glycol dimethacrylate, triethylene glycol diacrylate, triethylene glycol dimethacrylate, or the like.

Suitable vinyl monomeric units include styrene, substituted styrene such as methylstyrene, methoxystyrene, t-butylstyrene, chlorostyrene, and α-methylstyrene.

Suitable vinyl ester monomeric units include vinylacetate, vinylpropionate, vinylbutyrate, vinyl 2-ethylhexanoate, vinylstearate.

Suitable vinyl ether monomeric units include vinylmethyl ether, vinylethyl ether, vinylbutyl ether, vinyloctyl ether, vinyldecyl ether.

Suitable allylic monomeric units include allyl methacrylate.

Preferably the free radical initiator curing agent is without limitation a peroxide or hydroperoxide, sulfur analogues of peroxide or hydroperoxides, an azobisisobutyryl nitrile or a derivative thereof and the like.

Nonlimiting examples of peroxides and hydroperoxides include tert butyl hydroperoxide, cumene hydroperoxide, hydrogen peroxide, benzoyl peroxide, tetraline hydroperoxide, diisopropyl benzene hydroperoxide, acetyl peroxide, urea peroxide, methyl ethyl ketone peroxide, diisopropyl ether peroxide, Luperox 2,5-2,5 (a dihydroperoxide made by Elf Atochem), t-butylhydroperoxide, cumene hydroperoxide.

Non-limiting examples of azobisisobutyryl nitrile or derivatives thereof include without limitation 1, 1'-azobis (1-cyclohexanecarbonitrile), 2,2'-azobis(2,4-dimethylvaleronitrile).

The transition metal may be without limitation copper, manganese, cerium, iron, nickel, zirconium or cobalt. Preferably, the transition metal is in the form of a salt such as, without limitation a carboxylate or a naphthenate. Most preferably, the transition metal salt is cobalt naphthenate. Alternatively, the transition metal may in the form of a wire, such as, for example, a copper wire.

Preferably, the combination of the free radical curing agent and the metal catalyst forms a redox system. Non-limiting examples of such redox systems include molybdenum hexacarbonyl/carbon tetrachloride.

The copolymerization may be conducted in the presence of a co-initiator. The coinitiator may be any nucleophilic compound having an affinity to react with the transition metal and/or the free radical curing agent to facilitate production of a free radical. Examples of suitable coinitiators include, without limitation, dimethyl aniline, saccharin, 1-acetyl 2-phenylhydrazine, and mixtures thereof.

The copolymer may also include an extender or plasticizer. These components are well known in the art, and non-limiting, preferred examples include Industrene™ D, i.e., 2-ethyl hexyl dimerate, or Flexricin™ P-8, i.e., acetylated castor oil. The plasticizer is typically present in a sufficient amount such that the exterior moisture barrier layer is a re-enterable gel. This is generally an amount of about 10 to 200 parts by weight based on the weight of the copolymer in the composition, or about 1 to 66 weight percent of the protective layer.

The protective layer of the present invention may also include additives such as antioxidants, tackfiers, fillers, adhesion promoters, accelerators, theology additives and the like. These amounts and specific types of these components are generally known to one of ordinary skill in the art.

When the oligomer and monomer are copolymerized, the oligomer is preferably present in an amount of from about 10% to about 90% by weight of the total weight of the cured copolymer, most preferably from about 25% to about 75% by weight of the total weight of the cured copolymer. The monomer is preferably present in an amount of from about 10% to about 90% by weight of the total weight of the cured copolymer, most preferably from amount of from about 25% to about 75% by weight of the total weight of the cured copolymer. It is advantageous to utilize a greater amount of monomer than copolymer, and different monomers can be used in combination to achieve the desired properties of the coating. The free radical initiator preferably is present in an amount of from about 0.2% to about 10% by weight of the total weight of the cured copolymer, most preferably in an amount of from about 1 to about 1.5% by weight of the total weight of the cured copolymer.

When at least two oligomers are copolymerized, the oligomers are preferably present in an amount of from 10% to 90% by weight of the total weight of the cured polymer, most preferably from about 25% to about 75% by weight of total weight of the cured polymer. The free radical initiator preferably is present in an amount of from about 0.2% to about 10% by weight of the total weight of the cured copolymer, most preferably in an amount of from about 1 to about 1.5% by weight of the total weight of the cured copolymer.

Preferably, the electrical component is a telecommunications cable splice, a circuit board or a coil wound motor. The outer surface is made of polyethylene, polypropylene, polyvinylchloride, polycarbonate. The coating protects the outer surface from environmental, mechanical and electrical interferences such as corrosion from dirt, dust, moisture, mildew, physical abrasion, damage from handling and short circuits, etc. Preferably, the protective layer provides an electrically conductive coating. Preferably, the coating is re-enterable, allowing it to be easily removed from the component when repairs are to be made.

The exterior protective layer may be applied on the electrical component by contacting at least a portion of the exterior surface of the electrical component with at least one oligomer having a terminally ethylenically unsaturated group, at least one monomer having a terminally ethylenically unsaturated group, a free radical initiator curing agent, and a transition metal. The oligomer and monomer are copolymerized on the surface portion to form the exterior protective layer thereon.

Alternatively, the exterior protective layer may be applied on the electrical component by contacting at least a portion of the exterior surface of the electrical component with at least two oligomers having a terminal ethylenically unsaturated group, a free radical initiator curing agent, and a transition metal. The oligomers are copolymerized on the surface portion to form the exterior protective layer thereon.

Preferably, the at least one oligomer and the at least one monomer, or the at least two oligomers, and the curing agent are provided in the same package and are contacted with the surface while the transition metal is separately provided and contacted with the surface. The at least one oligomer and the at least one monomer, or the at least two oligomers, and the curing agent may be contacted with the surface simultaneously with the transition metal or may be contacted with the surface prior to the transition metal. If the transition metal is in the form of a wire, it may be wrapped around the outer surface of the component so as to contact the at least one oligomer and the at least one monomer, or the at least two oligomers, and the curing agent previously contacted with the outer surface.

The step of copolymerizing may be performed at ambient temperature, although it is advantageous to do this at a temperature of from about 40° C. to about 60° C.

The layer may be applied to act as a sealant, an encapsulant or a potting compound. Most preferably, the layer is formulated so that it is a re-enterable gel.

The foregoing and other objects, features, aspects and advantages of the present invention will become more apparent from the following detailed nonlimiting examples of the present invention. In these examples, all parts are given by weight unless otherwise specified.

EXAMPLE 1

The following example illustrates the preparation of a typical copolymer of this invention which is intended for use as an exterior protective layer for an electrical component. The first component is contacted with the surface simultaneously with the second component at a temperature of 25° C.

TABLE 1

|  | Amount |
|---|---|
| First Component Mixture | |
| butadiene acrylate oligomer (1) | 15 |
| lauryl methacrylate | 12 |
| isobornyl acrylate | 9 |
| C-14 diol acrylate | 0.2 |
| Cumene hydroperoxide | 1.2 |
| Plasticizer (2) | 61 |
| Antioxidant (3) | 0.5 |
| Second Component | |
| Cobalt Naphthenate (4) | 1.1 |

(1) Poly-BD R300 ™ from Arco Chemicals
(2) Flexricin P-8 ™ from CasChem, Inc. and Ethyl Industrene D ™ from CasChem, Inc.
(3) Irganox 1010 from Ciba Geigy
(4) Nuxtra Cobalt 12% from Mooney Chemical

EXAMPLE 2

The following example illustrates the preparation of a typical copolymer of this invention which is intended for use as an exterior protective layer for an electrical component. The first component is contacted with the surface followed by wrapping the second component around the surface so as to contact the first compound, preferably at a temperature of 25° C.

TABLE 2

|  | Amount (g) |
|---|---|
| First Component Mixture | |
| butadiene acrylate oligomer (1) | 108 |
| Cumene hydroperoxide | 6 |
| 1-acetyl 2-phenyl-hydrazine | 3 |
| Saccarin | 6 |
| Plasticizer (2) | 177 |
| Second Component | |
| Copper Wire | |

(1) Poly BD R300 ™ from Arco Chemicals.
(2) Flexricin P-8 ™ from CasChem Inc.

EXAMPLE 3

Various properties of the copolymers of Example 1 and 2 were compared to the properties of a urethane encapsulant described and claimed in U.S. Pat. No. 4,666,968. The properties were measured with respect to application of the encapsulant coating to a telecommunications cable splice. Results are shown in Table 3.

TABLE 3

| PROPERTY | EXAMPLE 1 | EXAMPLE 2 | COMPARATIVE URETHANE ENCAPSULANT |
|---|---|---|---|
| Hardness (Shore 00) | 40 | — | 55 |
| % Elongation | 50 | 50 | 120 |
| Tensile Strength (PSI) | 5.5 | 12.3 | 26 |
| Tear Strength (PLI @ 77° F.) | 1 | 1.5 | 5 |
| 168 Hours/Boiling water (% wt. change) | −7.0 | — | +1.4 |
| Migration (77° F., 21 days % wt change) | | | |
| Flexgel | 4.0 | — | 4.0 |
| PJ Cable Grease | 0.2 | — | 0.6 |
| Migration (140° F., 7 days % wt change) | | | |
| Flexgel | 11.1 | — | 5.4 |
| PJ Cable Grease | 0.7 | — | 1.6 |
| Insulation Resistance (ohms) | 2. 65 × 10$^{10}$ | — | 1.5 × 10$^{13}$ |
| Viscosity (cps at 77° F.) | 120 | — | 180 |
| Gel Time (hr) | 8.5 | — | 1 |
| Shelf Life (140° F. aging) | pass | — | pass |
| Copper Corrosion | noncorrosive | — | noncorrosive |
| Polycarbonate Stress Cracking | pass | — | pass |

As shown above, the copolymer of the present invention not only has improved protective properties, but it also is easier to remove from the splice. Also the mix viscosity of the copolymer of the present invention is lower than that of the comparative example, allowing for both better penetration of the cable splice and a reduction in voids.

What is claimed is:

1. A method for providing an exterior moisture barrier layer of a cured copolymer on the outer surface of an electrical component, which comprises:

contacting at least a portion of the outer surface of the electrical component with a composition comprising at least one oligomer having a terminal ethylenic group, at least one polymerizable monomer having a terminal ethylenic group, a free radical initiator curing agent, and a transition metal salt; and copolymerizing the at least one oligomer and the at least one monomer upon the outer surface portion of the electrical component to form an exterior moisture barrier layer thereon.

2. The method of claim 1, wherein the transition metal salt is present in an amount of about 0.2 to 10 weight percent of the total weight of the cured copolymer.

3. The method of claim 2, wherein the transition metal salt is present in an amount of about 1 to 1.5 weight percent of the total weight of the cured copolymer.

4. The method of claim 1, wherein the copolymerizing is performed at a temperature of from about 25° to about 60° C.

5. The method of claim 1, wherein the layer is applied to seal the electrical component.

6. The method of claim 1, wherein the layer is applied to encapsulate the electrical component.

7. The method of claim 1, wherein the layer is applied as a potting compound upon the electrical component.

8. The method of claim 1, wherein the exterior moisture barrier layer is applied as a re-enterable gel.

9. The method of claim 1, wherein the free radical initiator curing agent is a peroxide, a hydroperoxide, an azobisisobutyryl nitrile, or a disulfide.

10. The method of claim 9, wherein the free radical initiator curing agent is a hydroperoxide.

11. The method of claim 10, wherein the hydroperoxide is cumene hydroperoxide.

12. The method of claim 1, wherein the free radical initiator curing agent is present in an amount of from about 0.2% to about 10% by weight of the total weight of the cured copolymer.

13. The method of claim 11, wherein the free radical initiator curing agent is present in an amount of from about 0.2% to about 10% by weight of the total weight of the cured copolymer.

14. The method of claim 13, wherein the free radical initiator curing agent is present in an amount of from about 1.0 to about 1.5% by weight of the total weight of the cured copolymer.

15. The method of claim 1, wherein the transition metal of the salt is copper, manganese, cerium, iron, nickel, zirconium or cobalt.

16. The method of claim 15, wherein the transition metal salt is a carboxylate or a naphthenate.

17. The method of claim 16, wherein the transition metal salt is cobalt naphthenate.

18. The method of claim 1, wherein the copolymerizing is in the further presence of a co-initiator.

19. The method of claim 18, wherein the co-initiator is a mixture of dimethyl aniline, saccharin and 1-acetyl 2-phenylhydrazine.

20. The method of claim 1 which further comprises initially applying the oligomer, monomer and curing agent to a portion of the outer surface of the electrical component, and subsequently applying the transition metal salt to the portion upon which the oligomer, monomer and curing agent were applied.

21. The method of claim 1 which further comprises applying an extender to the outer surface of the electrical component to form part of the layer.

22. The method of claim 21 wherein the extender is a plasticizer and is applied to the outer surface of the component with the oligomer and monomer.

23. A method for providing an exterior protective layer of a cured copolymer on the outer surface of an electrical component, which comprises:

contacting at least a portion of the outer surface of the electrical component with a composition comprising at least two oligomers having a terminal ethylenic group, a free radical initiator curing agent, and a transition metal; and copolymerizing the at least two oligomers upon the outer surface portion of the electrical component to form an exterior protective layer thereon.

24. The method of claim 23, wherein the copolymerizing is performed at a temperature of from about 25° to about 60° C.

25. The method of claim 23, wherein the layer is applied to seal the electrical component.

26. The method of claim 23, wherein the layer is applied to encapsulate the electrical component.

27. The method of claim 23, wherein the layer is applied as a potting compound upon the electrical component.

28. The method of claim 23, wherein the exterior protective layer is applied as a re-enterable gel.

29. The method of claim 23, wherein the free radical initiator curing agent is a peroxide, a hydroperoxide, an azobisisobutyryl nitrile, or a disulfide.

30. The method of claim 29, wherein the free radical initiator curing agent is a hydroperoxide.

31. The method of claim 30, wherein the hydroperoxide is cumene hydroperoxide.

32. The method of claim 23, wherein the free radical initiator curing agent is present in an amount of from about 0.2% to about 10% by weight of the total weight of the cured copolymer.

33. The method of claim 31, wherein the free radical initiator curing agent is present in an amount of from about 0.2% to about 10% by weight of the total weight of the cured copolymer.

34. The method of claim 33, wherein the free radical initiator curing agent is present in an amount of from about 1.0 to about 1.5% by weight of the total weight of the cured copolymer.

35. The method of claim 23, wherein the transition metal is copper, manganese, cerium, iron, nickel, zirconium or cobalt.

36. The method of claim 35, wherein the transition metal is copper.

37. The method of claim 36, wherein the transition metal is provided in the form of a wire.

38. The method of claim 23, wherein the copolymerizing is in the further presence of a co-initiator.

39. The method of claim 38, wherein the co-initiator is a mixture of dimethyl aniline, saccharin and 1-acetyl 2-phenylhydrazine.

40. The method of claim 23 which further comprises initially applying the at least two oligomers and the curing agent to a portion of the outer surface of the electrical component, and subsequently applying the transition metal to the portion upon which the at least two oligomers and the curing agent were applied.

41. The method of claim 23 which further comprises applying an extender to the outer surface of the electrical component to form part of the layer.

42. The method of claim 41 wherein the extender is a plasticizer and is applied to the outer surface of the component with the at least two oligomers.

* * * * *